(12) United States Patent
Kobayakawa et al.

(10) Patent No.: US 7,781,888 B2
(45) Date of Patent: Aug. 24, 2010

(54) SURFACE MOUNTING ELECTRONIC COMPONENT AND MANUFACTURING METHOD THEREOF

(75) Inventors: Masahiko Kobayakawa, Kyoto (JP); Masahide Maeda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 593 days.

(21) Appl. No.: 11/597,489

(22) PCT Filed: May 12, 2005

(86) PCT No.: PCT/JP2005/008715

§ 371 (c)(1),
(2), (4) Date: Nov. 22, 2006

(87) PCT Pub. No.: WO2005/122251

PCT Pub. Date: Dec. 22, 2005

(65) Prior Publication Data

US 2007/0247821 A1    Oct. 25, 2007

(30) Foreign Application Priority Data

Jun. 8, 2004    (JP) ............................. 2004-170386

(51) Int. Cl.
*H01L 23/04* (2006.01)
(52) U.S. Cl. ................. 257/730; 257/690; 257/E23.061
(58) Field of Classification Search ................. 257/690, 257/730; 438/110, 112, 114
See application file for complete search history.

(56) References Cited

U.S. PATENT DOCUMENTS

| 6,482,730 B1 * | 11/2002 | Masumoto et al. .......... 438/617 |
| 6,580,161 B2 | 6/2003 | Kobayakawa |
| 6,773,961 B1 * | 8/2004 | Lee et al. .................... 438/112 |
| 2003/0143819 A1 * | 7/2003 | Hedler et al. ............... 438/462 |

FOREIGN PATENT DOCUMENTS

| JP | 11-163007 | 6/1999 |
| JP | 2001-28420 | 1/2001 |
| JP | 2002-222906 | 8/2002 |

OTHER PUBLICATIONS

Peter Zant, Microchip Fabriacation, fifth edition, 2004, p. 595.*
International Search Report for corresponding PCT application PCT/JP2005/008715, mailed Jun. 7, 2005.

* cited by examiner

*Primary Examiner*—Marcos D. Pizarro
*Assistant Examiner*—Eva Yan Montalvo
(74) *Attorney, Agent, or Firm*—Hamre, Schumann, Mueller & Larson, P.C.

(57) ABSTRACT

The electric component includes at least a set of electrode terminals 2, 3, a semiconductor element 4 electrically connected with the set of electrode terminals, and a package 6 made of synthetic resin and sealing the electrode terminals and the semiconductor element with part of a lower surface of each of the electrode terminals exposed at a lower surface of the package. A cover layer 11 made of synthetic resin is formed to cover a cut surface of a tip of a connector lead remainder extending integrally outward from the each of the electrode terminals. Thus, disadvantages resulting from exposure of the cut surface of the tip of the connector lead remainder are eliminated.

4 Claims, 9 Drawing Sheets

SURFACE MOUNTING ELECTRONIC COMPONENT AND MANUFACTURING METHOD THEREOF

TECHNICAL FIELD

The present invention relates to an electronic component, such as a diode or a transistor, which is to be surface-mounted on a printed circuit board etc., by soldering and in particular to an electronic component that includes a terminal electrode partially exposed at the lower surface of the package of the electronic component as a soldering surface, and also relates to a method of manufacturing such an electronic component.

BACKGROUND ART

A conventional electronic component 1' of surface mount type, disclosed in FIG. 13 of Patent Document 1 for example, is configured as shown in the accompanying FIGS. 18-20.

Specifically, the surface mount type electronic component 1' includes an electrode terminal 2', two electrode terminals 3', a semiconductor element 4', such as a semiconductor chip, mounted on the upper surface of the electrode terminal 2', metal wire 5' electrically connecting the semiconductor element 4' and the two electrode terminals 3' by e.g. wire bonding, and a synthetic resin package 6' sealing the whole in a manner such that the lower surfaces of the electrode terminals 2' and 3' are partially exposed at the lower surface of the package 6' as mounting surfaces 7' and 8' for soldering.

In the manufacturing process of the conventional electronic component 1' described above, as disclosed in Patent Document 1, a lead frame of metal plate which is not shown is prepared. The lead frame includes at least one set of electrodes 2' and 3' to constitute an electronic component, and connecting leads 9' and 10' which support and are connected with the electrode terminals 2' and 3' integrally. A semiconductor element 4' is mounted on each of the sets of electrode terminals 2' and 3', wire bonding is performed with metal wire 5', and further the package 6' is formed of synthetic resin by transfer molding before cutting the connecting leads 9' and 10' at the side surfaces of the package 6' to separate the lead frame into individual electronic components 1'.

Patent Document 1: JP-A-2002-222906

DISCLOSURE OF THE INVENTION

Problems to be Solved by the Invention

With the conventional technique, producing the connecting leads 9' and 10' supporting and connecting integrally each of the electrode terminals 2' and 3' to have an arrow width and small thickness through e.g. partial etching of the lead frame facilitates cutting of the connecting leads 9' and 10' at the side surfaces of the package 6' and at the same time, however, cut surfaces of the connecting leads 9' and 10' are exposed at the side surfaces of the package 6'.

Above-described exposure of the cut surfaces of the connecting leads 9' and 10' at the side surfaces of the package 6' causes the following problems:

i) Solder bridges tend to be produced between the cut surfaces of the connecting leads 9' and 10' of the electronic component 1' and wiring patterns of the printed circuit board etc. when the electronic component 1' having above-described configuration is mounted and soldered onto the printed circuit board.

ii) When a plurality of the electronic components 1' having above-described configuration are arranged side by side and soldered, there is a possibility that electric discharge occurs between the cut surfaces of the connecting leads 9' and 10' of adjacent electronic components 1'. Further, solder bridges tend to be produced between the cut surfaces of the connecting leads 9' and 10' of adjacent electronic components 1'. Accordingly, the pitch interval of the electronic components 1' needs to be large, whereby the number of the electronic components which can be mounted in a unit area, i.e. mounting density, cannot be large.

iii) Due to exposure of the cut surfaces of the connecting lead 9' and 10', corrode such as rust generates at the cut surfaces as well as moisture resistance inside the package 6' is degraded.

It is, therefore, an object of the present invention to provide an electronic component which solves the problems described above, and a method of manufacturing such an electronic component.

Means for Solving the Problems

To achieve the technical object, according to one embodiment of the present application, there is provided a surface mounting electronic component comprising: a set of electrode terminals; a semiconductor element electrically connected with the set of electrode terminals; and a package made of synthetic resin for sealing the electrode terminals and the semiconductor element in a manner such that each of the electrode terminals is at least partially exposed to serve as a mounting surface for soldering at a lower surface of the package.

In the above component, each of the electrode terminals includes an outwardly extending integral connector lead remainder which has a cut tip surface covered by a coating layer of synthetic resin at a side surface of the package.

According to one embodiment of the present application, in the surface mounting electronic component as described above, the side surface of the package includes a cutout at which the cut tip surface of the connector lead remainder is exposed, with the coating layer formed at the cutout.

According to one embodiment of the present application, in the surface mounting electronic component as described above, wherein the coating layer includes an upwardly sloping surface at the lower surface of the package.

According to one embodiment of the present application, there is provided a method of manufacturing surface mounting electronic components. The method comprises the steps of:

forming a lead frame from a metal plate to include prearranged sites for producing a plurality of electronic components, each of the sites being formed with a set of electrode terminals for constituting one of the electronic components, the electrode terminals being integrally connected via a connector lead remainder;

electrically connecting a semiconductor element to the set of electrode terminals in the lead frame;

forming a synthetic resin plate body on the lead frame to seal the electrode terminals and the semiconductor element in a manner such that at least part of a lower surface of each electrode terminal at a lower surface of the plate body as a mounting surface for soldering;

making a hollow groove at the lower surface of the plate body between the electronic components, the groove being deep enough to cut the connector lead remainder;

filling the hollow groove with synthetic resin for coating; and cutting a part of the plate body inside the hollow groove in a manner such that a piece of the synthetic resin remains at both sides of the hollow groove as a coating layer, thereby providing separate electronic components.

According to one embodiment of the present application, in the method described above, the filling of the hollow groove with synthetic resin is performed to cause the synthetic resin to have a arch-like caved surface.

According to one embodiment of the present application, in the method described above, the hollow groove has a width which is 1-2 times as large as a depth of the hollow groove.

According to one embodiment of the present application, in the method described above, the filling of the hollow groove with synthetic resin is performed with the plate body turned upside down to cause its lower surface to face upward.

ADVANTAGES OF THE INVENTION

As described above, a cover layer of synthetic resin is formed at the side surface of the package of the electronic component to cover the cut surface of the tip of the connecting lead extending integrally outward from the electrode terminal, whereby the whole connecting lead is perfectly sealed with the package and the cover layer formed at the side surface thereof.

With such a configuration, when the electronic component is mounted and soldered onto the printed circuit board etc., solder bridges are surely prevented from generating between the portion of the electronic component other than mount surfaces for soldering and the printed circuit board etc.

Further, when a plurality of the electronic components are arranged side by side and mounted onto the printed circuit board etc. for soldering, the cover layer surely prevents electric discharge and solder bridges from generating between adjacent electronic components, enabling the pitch intervals of the electronic components to be narrow and thereby the mounting density to advance.

Moreover, the cover layer surly prevents corrode such as rust from generating at cut surfaces of the connecting leads as well as surely advances the moisture resistance inside the package.

In this case, as described in one embodiment above, the side surface of the package is provided with a cutout at which the cut surface of the tip of the connecting lead is exposed, and the cover layer is formed at the cutout, whereby the cover layer is prevented from protruding at the side surface of the package, and thereby growth in size or in weight due to formation of the cover layer is prevented.

Further, as described in one embodiment above, the cover layer includes a sloping surface which corresponds to part of the lower surface of the package, whereby the sloping surface facilitates inspection of a solder fillet from outside better than in the case that the sloping surfaces do not exist, thereby making it sure and easy to discriminate to pass or fail with regard to soldering from existence of a solder fillet.

Moreover, according to the method described in one embodiment above, by carving a hollow groove, filling the hollow groove with synthetic resin, and cutting a part inside the groove, a plurality of the electronic components are simultaneously manufactured from a sheet of lead frame in a manner such that the cover layer formed at the side surface of the package covers the cut surface of the connecting lead, whereby a plurality of the electronic components as described above are produced with low cost.

According to the method described in one embodiment above, producing a sloping surface at the lower surface of the package described in one embodiment above is performed at the same time of filling the groove with synthetic resin, whereby the sloping surface is produced without cost rise.

Further, according to the method described in one embodiment above, when the groove C is filled with synthetic resin, it is not required to set the width dimension W of the groove large, nor to increase the pitch interval of the electronic components, whereby the number of electronic components which are obtained from a sheet of lead frame does not reduce inconveniently, and the manufacturing cost reduces.

In addition, according to the method describe in one embodiment above, it becomes easy to fill the groove with synthetic resin.

DESCRIPTION OF SIGNS

| DESCRIPTION OF SIGNS | |
| --- | --- |
| 1 | electronic component |
| 2, 3 | electrode terminal |
| 4 | semiconductor element |
| 5 | metal wire |
| 6 | package |
| 6a | lower surface of package |
| 7, 8 | mounting surface for soldering |
| 9, 10 | connecting lead |
| 11 | cover layer |
| 12, 13 | plating layer |
| A | lead frame |
| A1 | longitudinal cutting line |
| A2 | lateral cutting line |
| B | plate body |
| C | hollow groove |
| D | synthetic resin |

BEST MODE FOR CARRYING OUT THE INVENTION

Preferred embodiments of the present invention will be described below with reference to the accompanying drawings.

FIGS. 4-16 show a manufacturing method according to an embodiment of the present invention.

Figure 1:
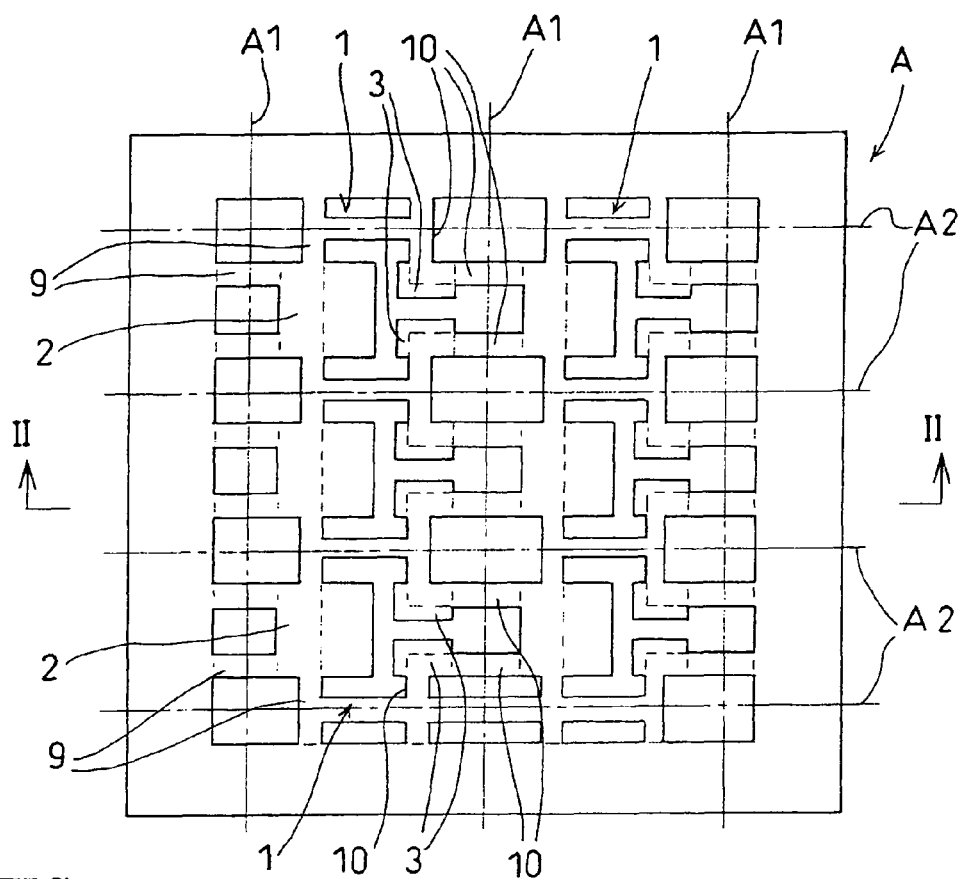
FIG. 1 is a plan view showing a lead frame used in the manufacturing method according to the present invention.
Figure 2:
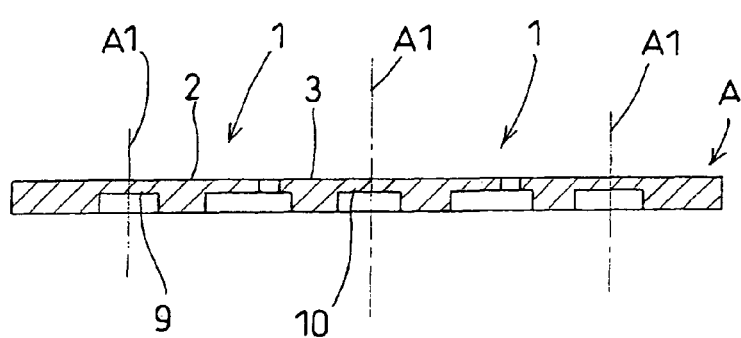
FIG. 2 is a sectional view taken along line II-II in FIG. 1.

In the manufacturing method according to the embodiment, as shown in FIG. 1, a lead frame A of metal plate is firstly prepared which has a size enough to produce simultaneously a plurality of electronic components to be produced in a matrix arrangement extending longitudinally and laterally. The lead frame A is provided with a set of one electrode terminal 2 and two electrode terminals 3 as well as connecting leads 9 and 10 which locate between electrode terminals 2 and 3, which are produced through punching process, at each of the portions of the lead frame A segmented by longitudinal cutting lines A1 and lateral cutting lines A2 and corresponding to an electronic component 1. The connecting lead 9 and 10 have a narrow width and connect the electrode terminals 2 and 3.

In this process, part of the electrode terminals 2, 3 and entire the connecting leads 9, 10 is formed to have thin thickness through half-etching at portions of the lower surface of the lead frame A.

Figure 3:
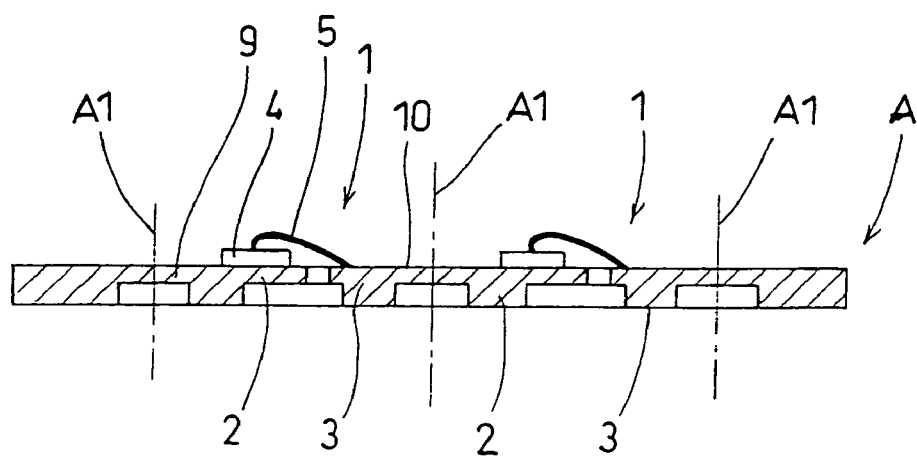
FIG. 3 is a chart showing a first process of the manufacturing method according to the present invention.
Figure 4:
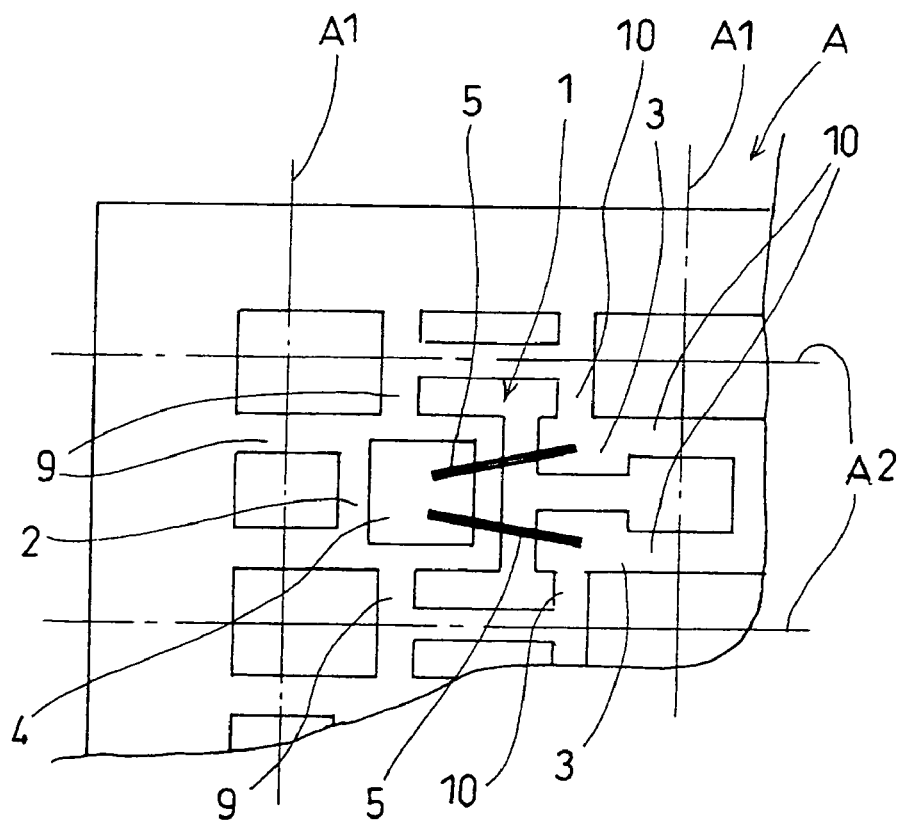
FIG. 4 is an enlarged plan view showing the principal portion of FIG. 3.

Subsequently, as shown in FIGS. 3 and 4, die bonding of the semiconductor element 4 such as a semiconductor chip is performed at the upper surface of the electrode terminal 2 of the lead frame A whereas wire bonding is performed with the metal wires 5 between the semiconductor element 4 and the electrode terminals 3.

Figure 5:
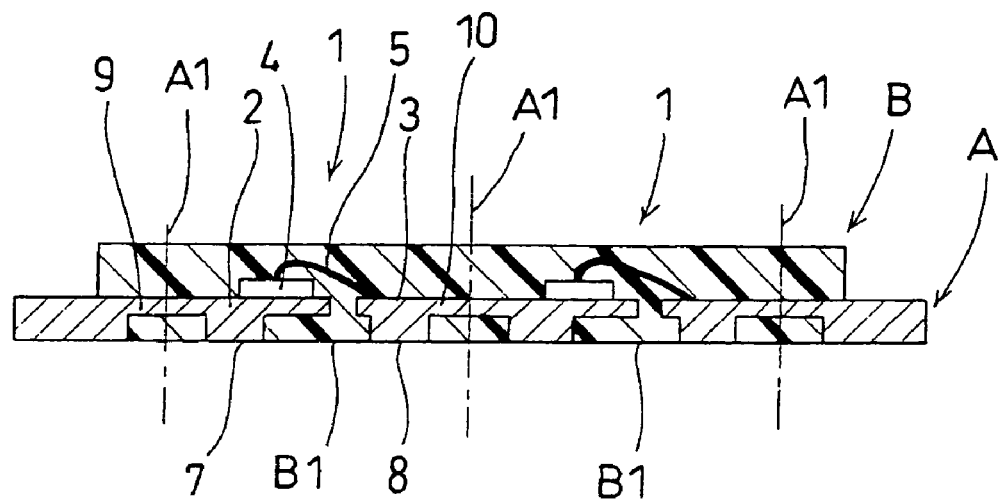
FIG. 5 is a chart showing a second process of the manufacturing method according to the present invention.

Subsequently, as shown in FIG. 5, the plate body B of thermosetting synthetic resin such as epoxy resin is provided through transfer molding in a manner such that the electrode terminals 2 and 3, the semiconductor elements 4, and metal wires 5 are entirely sealed in the plate body 2.

In this transfer molding of the plate body B, the lower surface B1 of the plate mold B is provided in a manner such that at least some of the lower surface of the electrode terminals 2 and 3 not having thin thickness are exposed as mounting surfaces 7, 8 for soldering.

In this situation, if the plate body B is cut along the longitudinal cutting lines A1 and lateral cutting lines A2 to separate a plurality of electronic components, cut surfaces of the connecting leads 9, 10 are exposed at the side surfaces of each of the electronic components 1.

Figure 6:
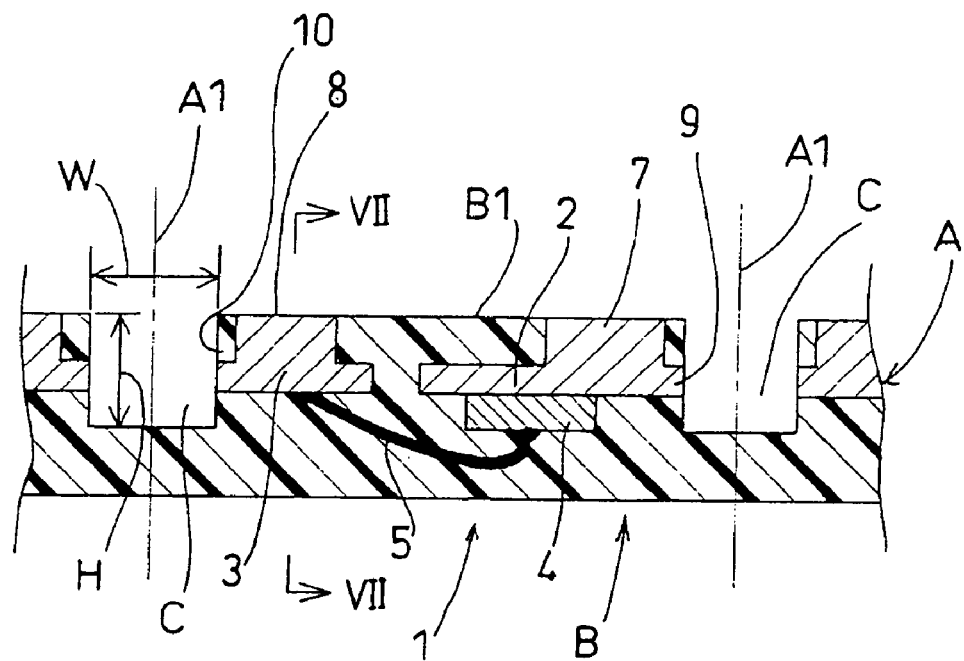
FIG. 6 is a chart showing a third process of the manufacturing method according to the present invention.
Figure 7:
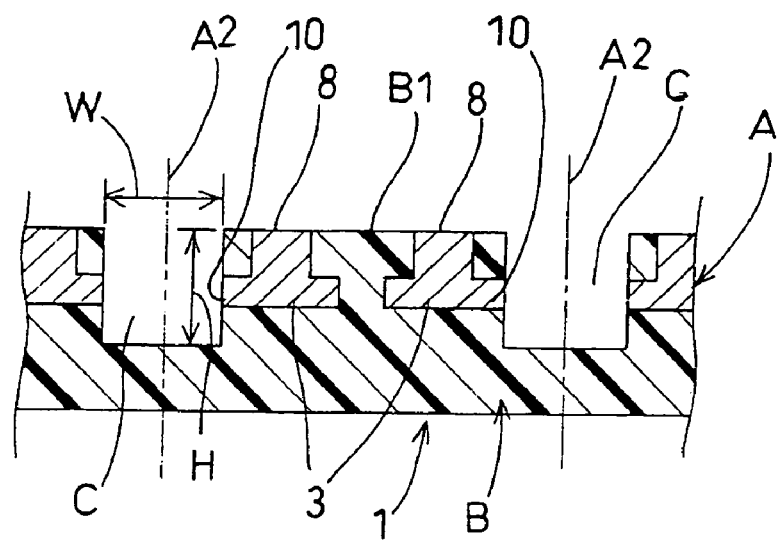
FIG. 7 is a sectional view taken along line VII-VII in FIG. 6.

In the present invention, alternatively, the lead frame A is turned upside down to cause the lower surface of the plate body B to face upside as shown in FIGS. 6 and 7, and then hollow grooves C having width W are carved through a cutting process using a proper working tool along the longitudinal cutting lines A1 and lateral cutting lines A2, which correspond to the portions of the plate body B intervening the electronic components 1.

In this case, the depth dimension H of the grooves from the lower surface B1 is set to cut the connecting leads 9, during the carving of the grooves C.

With such a process, the cut surfaces of the connecting leads 9, 10 are exposed at the both side surfaces of the grooves C.

Figure 8:
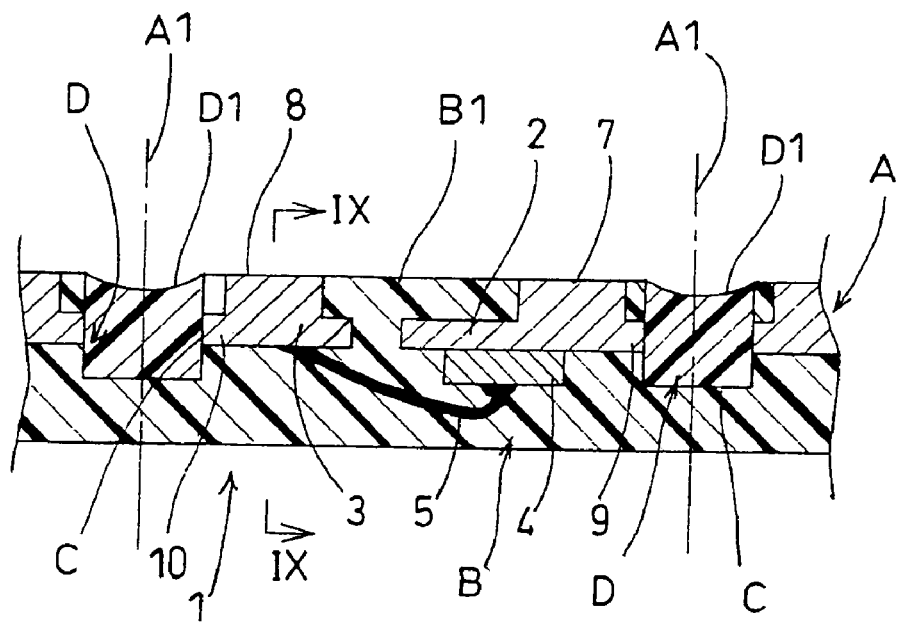
FIG. 8 is a chart showing a fourth process of the manufacturing method according to the present invention.
Figure 9:
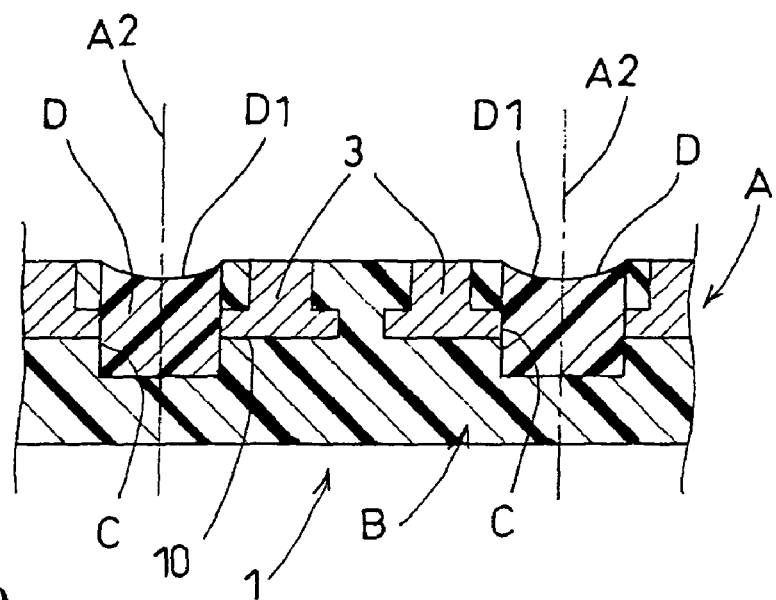
FIG. 9 is a sectional view taken along line IX-IX in FIG. 8.

Subsequently, as shown in FIGS. 8 and 9, the grooves C at the plate body B are filled with thermosetting synthetic resin D such as epoxy resin, similar to one constituting the plate body B, which is prepared in a liquid state and then the liquid resin is hardened.

In this filling process with synthetic resin D in a liquid state, the amount of synthetic resin D to be poured is set smaller than the capacity of a hollow groove C by a proper amount so that the upper surface D1 of synthetic resin D can become concave with the center potion lowered.

Figure 10:
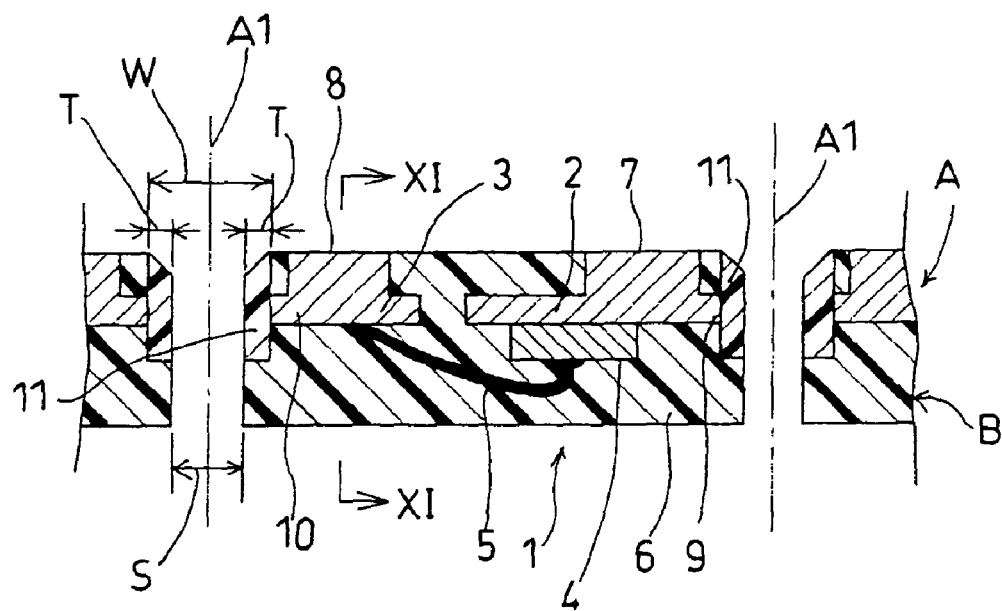
FIG. 10 is a chart showing a fifth process of the manufacturing method according to the present invention.
Figure 11:
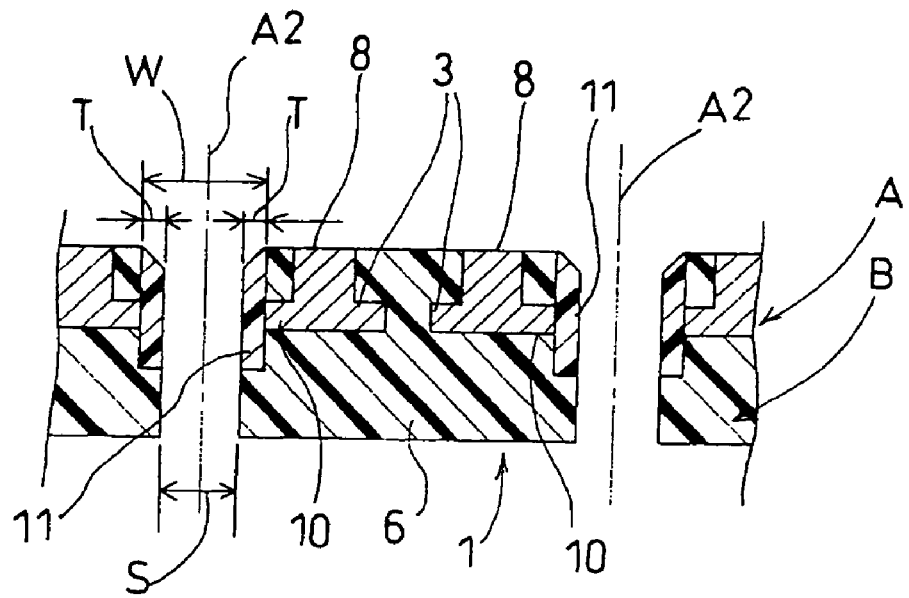
FIG. 11 is a sectional view taken along line XI-XI in FIG. 10.
Figure 12:
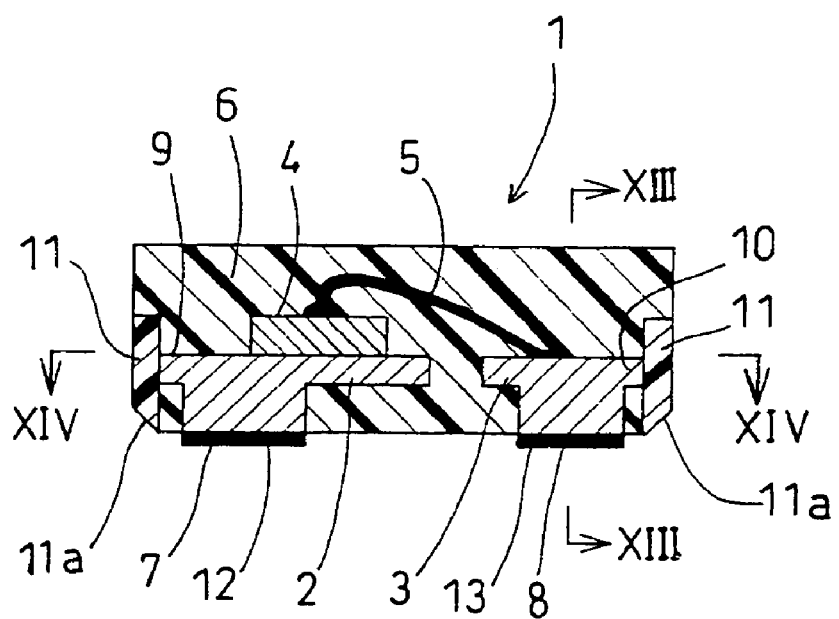
FIG. 12 is a vertical front view of an electronic component according to the embodiment of the present invention.
Figure 13:
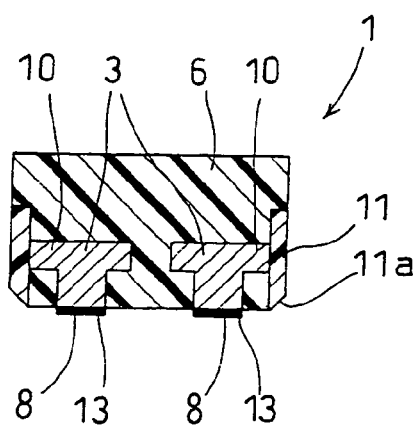
FIG. 13 is a sectional view taken along line XIII-XIII in FIG. 12.
Figure 14:
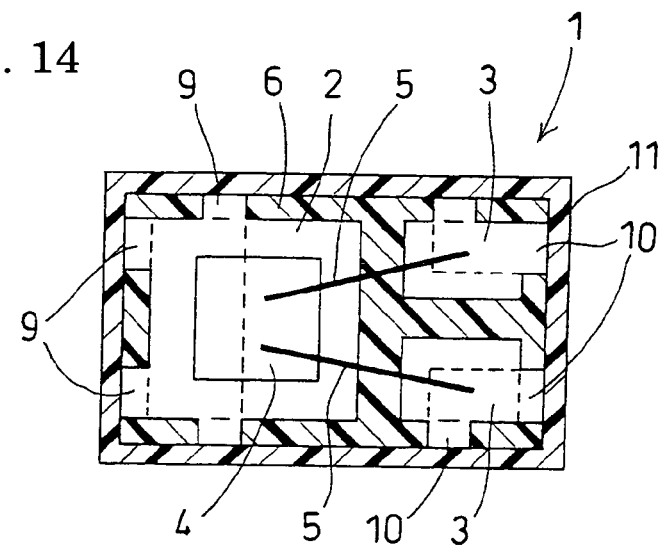
FIG. 14 is a sectional view taken along line XIV-XIV in FIG. 12.
Figure 15:
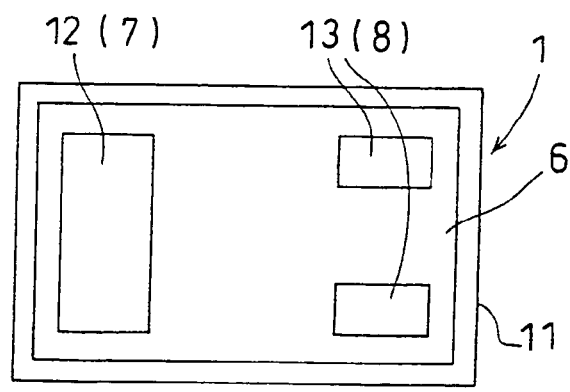
FIG. 15 is a bottom view of FIG. 12.
Figure 16:
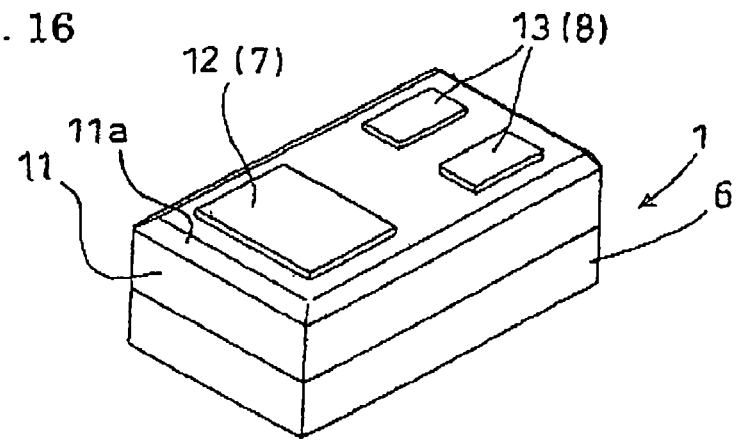
FIG. 16 is a perspective view of an electronic component according to the embodiment of the present invention.

Subsequently, as shown in FIGS. 10 and 11, the plate body is cut along the longitudinal cutting lines A1 and lateral cutting lines A2 with a dicing cutter (not shown) having a proper width S, whereby the plate body B is divided into a plurality of electronic components 1.

In this cutting and dividing process, the cutting width dimension S is set smaller than the width dimension W of the groove C by a proper dimension so that part of the synthetic resin D can remain at the both side surfaces of the groove C as a cover layer 11 having a predetermined thickness T.

Hereby, the cover layer 11 remaining at the both side surfaces of the groove C covers the cut surfaces of the connecting leads 9 and 10.

Subsequently, plating operation such as barrel plating is performed on the plurality of electronic components 1, whereby each of the obtained completed products of electronic components 1 has a surface at which the mounting surfaces 7, 8 formed with plating layers 12, 13 of metal with good solderability such as tin or solder are exposed.

The process of forming plating layers 12 and 13 may be performed prior to the dividing process of the plate body B into electronic components 1, for example, after the molding of the plate body B.

As shown in FIGS. 12-16, the electronic component 1 manufactured through the processes described above includes a set of electrode terminals 2 and 3, a semiconductor element 4 connected with the set of electrode terminals 2 and 3, a package 6 entirely sealing the electrode terminals 2, 3, and the semiconductor element 4 to expose at least part of the lower surfaces of the electrode terminals 2, 3 at the lower surface 6a of the package 6 as the mounting surfaces 7, 8 for soldering, and a cover layer 11 of synthetic resin provided at the side surfaces of the package 6 and covering the cut surfaces of the tips of the connecting leads 9 and 10 extending integrally outward from the electrode terminals 2 and 3.

With such a configuration, the entire connecting leads 9 and 10 are perfectly sealed with the package 6 and the cover layer 11 formed at the side surface thereof. Thereby, when the electronic component is mounted and soldered onto the printed circuit board etc., solder bridges are prevented from generating between portions other than ones used for mounting and soldering onto the printed circuit board, as well as solder bridges and electric discharge are prevented from generating between adjacent electronic components in the case that a plurality of electronic components are arranged side by side to be mounted and soldered. Further, corrode such as rust is perfectly prevented from generating at the ct surfaces of the connecting leads 9 and 10, whereby moisture resistance inside the package 6 is surly improved.

With such a manufacturing method described above, at the side surface of the package, the cutout at which the cutting surfaces of the tips of the connecting leads 9, 10 are exposed is shifted from the other portions by dimension T, and then the cover layer is formed at the cutout in a manner such that the surface of the cover layer does not protrude at the side surface of the package 6.

Further, with a manufacturing method described above, the lower surface 6a of the package 6 includes a sloping surface 11a of the cover layer which is formed because the upper surface of synthetic resin D1 is set concave when the groove C is filled with synthetic resin D for forming a cover layer 11.

Figure 17:
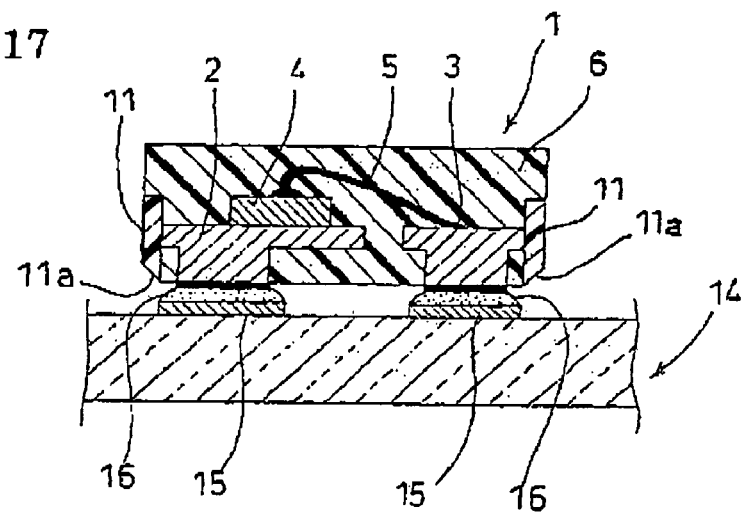
FIG. 17 is a chart showing an electronic component according to the embodiment of the present invention in a mounted and soldered state.
Figure 18:
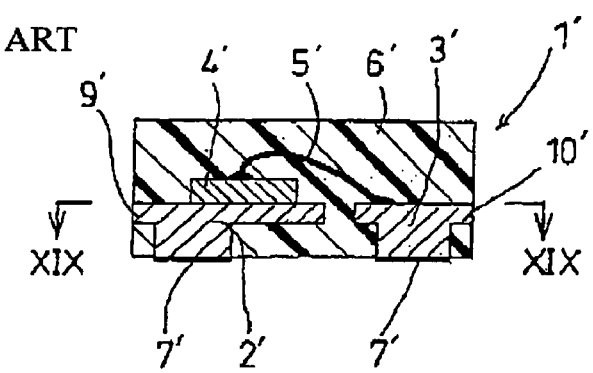
FIG. 18 is a vertical front view of a conventional electronic component.
Figure 19:
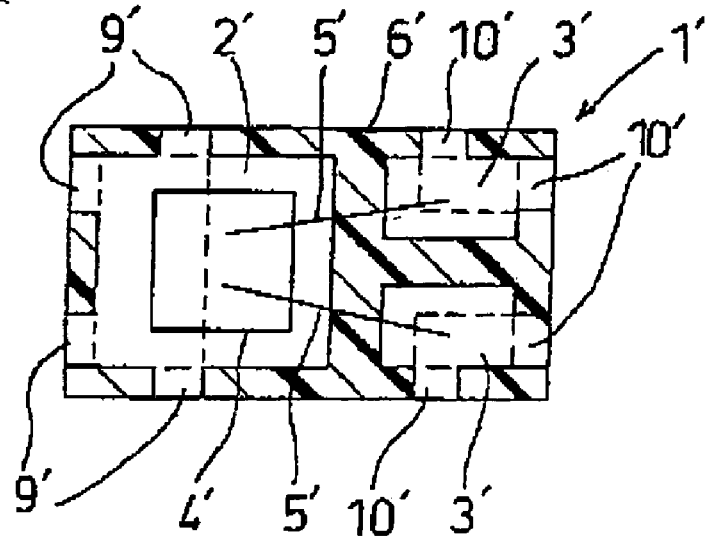
FIG. 19 is a sectional view taken along line XIX-XIX in FIG. 18.
Figure 20:
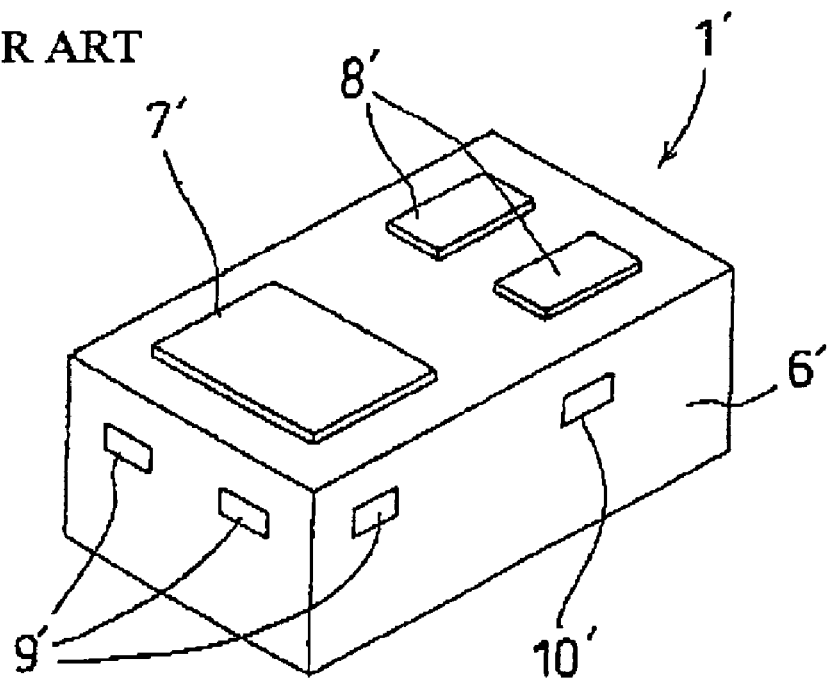
FIG. 20 is a perspective view of a conventional electronic component.

When the electronic component 1 is mounted and soldered onto the printed circuit board 14 as shown in FIG. 17, the sloping surface 11a facilitates inspection of a solder fillet 16 between the mounting surfaces 7, 8 and electrode pads 15 of the printed circuit board 14 from outside better than in the case that the sloping surfaces 11a do not exist Though the embodiment described above utilizes an electronic component 1 employing a set of electrode terminals consisting of one electrode terminal 2 and two electrode terminals 3, the present invention is not limited to such a configuration and may utilize an electronic component employing a set of electrode terminals consisting of one electrode terminal and one electrode terminal, a set of electrode terminals consisting of one electrode terminal and three or more electrode terminals, or a plurality of sets of electrode terminals.

Further, though the embodiment described above provides a manufacturing method in which a plurality of electronic components are arranged in a matrix expanding in longitudinal and lateral directions of the lead frame, the present invention is not limited to such a configuration and may adopt a method in which a plurality of electronic component are arranged in an either longitudinal or lateral line.

In the process of filling the groove C at the plate body B with synthetic resin in a liquid state, the larger the width dimension W of the hollow groove C is, the easier it is to fill the hollow groove C with synthetic resin.

However, when the width dimension W of the hollow groove C is set large, the pitch interval of the electronic components 1 arranged on the lead frame A is require to be large in response, whereby the number of electronic components 1 which are obtained from a sheet of lead frame A reduces inconveniently.

According to an experiment conducted by the inventors, it is preferable to set the width dimension W of the hollow groove C to 0.8-2 times as large as the depth dimension H of the hollow groove C.

Such a setting eliminates the need for elongating the width dimension W of the hollow groove C and thereby broadening the pitch of electronic components 1, and then prevents the amount of electronic components 1 obtained simultaneously from a sheet of lead frame A from reducing while it is surely and easily performed to fill the hollow groove C with synthetic resin D.

The invention claimed is:

1. A surface mounting electronic component comprising: a set of electrode terminals; a semiconductor element electrically connected with the set of electrode terminals; and a package made of synthetic resin for sealing the electrode terminals and the semiconductor element in a manner such that each of the electrode terminals is at least partially exposed to serve as a mounting surface for soldering at a lower surface of the package;
   wherein each of the electrode terminals includes an outwardly extending integral connector lead remainder which has a cut tip surface covered by a coating layer of synthetic resin at a side surface of the package, the coating layer being held in direct contact with the cut tip surface of the connector lead remainder at the side surface of the package,
   wherein the coating layer includes an upwardly sloping surface at the lower surface of the package.

2. The surface mounting electronic component according to claim 1, wherein the side surface of the package includes a cutout at which the cut tip surface of the connector lead remainder is exposed, the coating layer being formed only at the cutout in direct contact with the cut tip surface of the connector lead remainder.

3. The surface mounting electronic component according to claim 1, wherein each of the electrode terminals is formed with a plated metal layer at the lower surface of the package.

4. The surface mounting electronic component according to claim 2, wherein the side surface of the package includes a first side surface portion at the cutout and a second side surface portion outside the cutout, the coating layer includes a side surface flush with the second side surface portion of the package.

\* \* \* \* \*